US012731656B2

(12) United States Patent
Liao et al.

(10) Patent No.: US 12,731,656 B2
(45) Date of Patent: Sep. 8, 2026

(54) MEMORY DEVICE HEALTH MONITORING AND DYNAMIC ADJUSTMENT OF DEVICE PARAMETERS

(71) Applicant: Micron Technology, Inc., Boise, ID (US)

(72) Inventors: Dongxiang Liao, Cupertino, CA (US); Tomer Tzvi Eliash, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 168 days.

(21) Appl. No.: 18/627,984

(22) Filed: Apr. 5, 2024

(65) Prior Publication Data

US 2024/0347127 A1 Oct. 17, 2024

Related U.S. Application Data

(60) Provisional application No. 63/458,868, filed on Apr. 12, 2023.

(51) Int. Cl.
*G11C 29/52* (2006.01)
*G11C 29/02* (2006.01)

(52) U.S. Cl.
CPC ............ *G11C 29/52* (2013.01); *G11C 29/028* (2013.01)

(58) Field of Classification Search
CPC ...... G11C 29/52; G11C 29/028; G11C 29/021
USPC .................................................... 365/185.09
See application file for complete search history.

(56) References Cited

U.S. PATENT DOCUMENTS

2020/0110685 A1* 4/2020 Chew .................. G06F 11/3037

* cited by examiner

*Primary Examiner* — Huan Hoang
(74) *Attorney, Agent, or Firm* — Lowenstein Sandler LLP

(57) ABSTRACT

A method for monitoring health of a die in a memory device and dynamically adjusting a device parameter. The method includes receiving a request for performing a memory access operation on a first data unit of a memory device, and determining a value of a media state metric of the first data unit. The method further includes modifying a device parameter of the first data unit to form a modified device parameter in response to determining that the value of the media state metric of the first data unit is greater than a predetermined threshold value, and performing, using the modified device parameter, the memory access operation on the first data unit.

19 Claims, 6 Drawing Sheets

400

402 404 408 406

| Die # | RWB Index |
| --- | --- |
| 1 | 0.9 |
| 2 | 0.7 |
| 3 | 0.8 |
| . | . |
| . | . |
| N | 0.8 |
| Median RWB Index | 0.8 |

FIG. 4

MEMORY DEVICE HEALTH MONITORING AND DYNAMIC ADJUSTMENT OF DEVICE PARAMETERS

CROSS REFERENCE TO RELATED APPLICATIONS

This patent application claims priority to U.S. Provisional Patent Application No. 63/458,868 filed on Apr. 12, 2023, titled "MEMORY DEVICE HEALTH MONITORING AND DYNAMIC ADJUSTMENT OF DEVICE PARAMETERS," the entire contents of which is incorporated herein by reference.

TECHNICAL FIELD

Embodiments of the disclosure are generally related to memory sub-systems, and more specifically, are related to methods and system for monitoring health of a die in a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 4 schematically illustrates example metadata maintained by the memory sub-system controller for monitoring health of a die in a memory device and dynamically adjusting one or more device parameters, in accordance with embodiments of the present disclosure.

DETAILED DESCRIPTION

Figure 1:
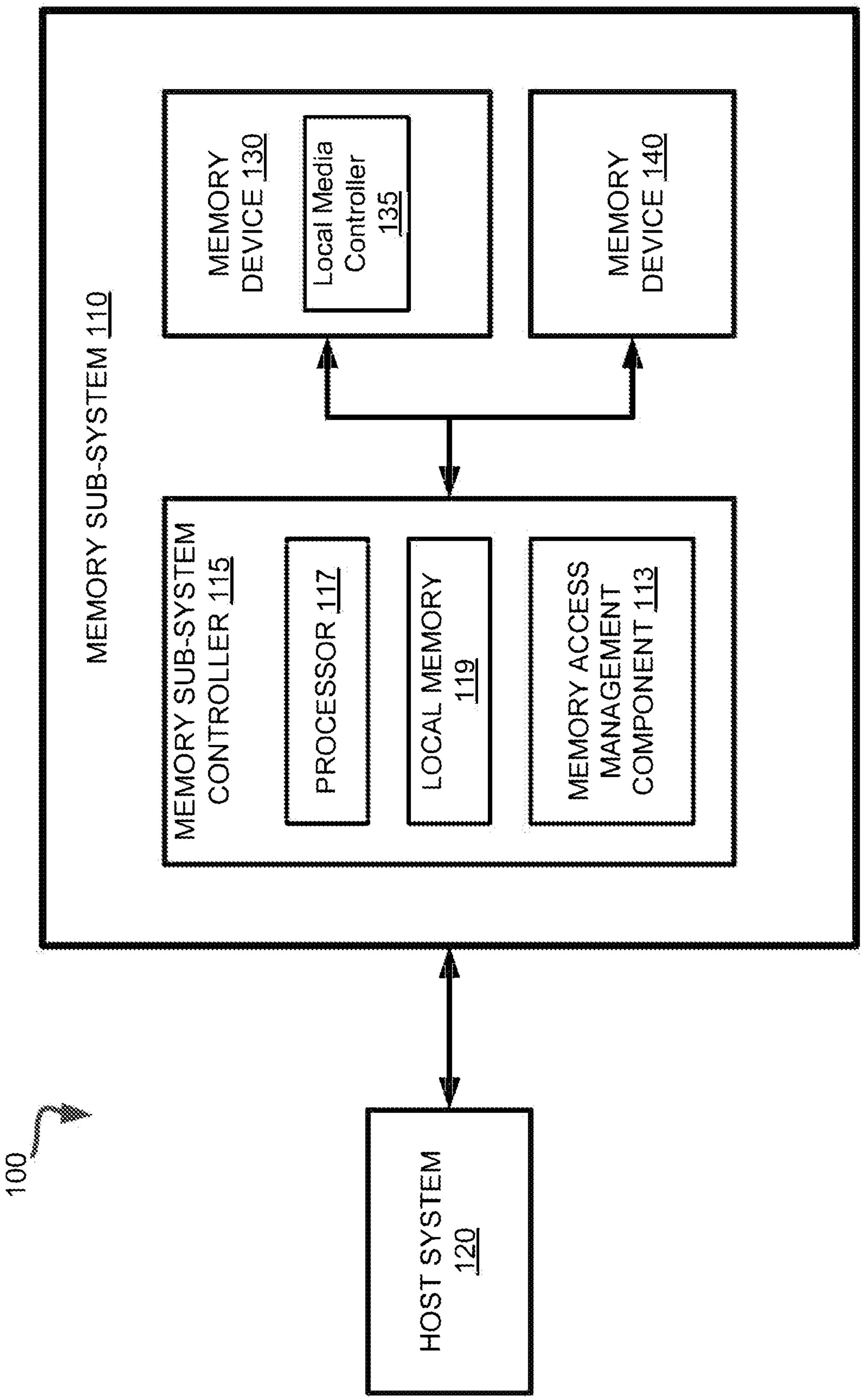
FIG. 1 illustrates an example computing system that includes a memory sub-system in accordance with some embodiments of the present disclosure.

Embodiments of the present disclosure are directed to methods and systems for monitoring health of a die in a memory device and dynamically adjusting a device parameter when the health of the die falls below a predefined threshold level. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by not-and (NAND) type flash memory devices. Other examples of non-volatile memory devices are described below in conjunction with FIG. 1. A non-volatile memory device is a package of one or more dies. Each die can consist of one or more planes. Planes can be grouped into logic units (LUN). For some types of non-volatile memory devices (e.g., NAND devices), each plane consists of a set of physical blocks. A "block" herein shall refer to a set of contiguous or non-contiguous memory pages. An example of a "block" is an "erasable block," which is a minimal erasable unit of memory, while "page" is a minimal writable unit of the memory device. Each page includes of a set of memory cells. A memory cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., error correction code (ECC), parity code), data version (e.g., used to distinguish age of data written), valid bitmap (which LBAs or logical transfer units contain valid data), etc. For example, upon reading data from a memory device, the memory sub-system controller can perform an error detection and correction operation. The error detection and correction operation includes identifying one or more errors (e.g., bit flip errors) in the read data. The memory sub-system can have the ability to correct a certain number of errors per management unit (e.g., using an error correction code (ECC)). As long as the number of errors in the management unit is within the ECC capability of the memory sub-system, the errors can be corrected before the data is provided to the requestor (e.g., the host system). The fraction of bits that contain incorrect data before applying ECC is called the raw bit error rate (RBER). The fraction of bits that contain incorrect data after applying ECC is called the uncorrectable bit error rate (UBER). Of the memory blocks, a block in which data cannot be stored may be a bad block. Bad blocks may be classified into a manufacture bad block (MBB), which occurs when the memory device is manufactured, and a grown bad block (GBB), which occurs in a procedure in which each memory block is used over time. When memory blocks in which data is stored are read, a memory block in which an uncorrectable error (e.g., uncorrectable ECC or UECC) occurs may be a grown bad block (GBB).

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows the establishment of multiple threshold voltage levels corresponding to different logical levels, thus effectively allowing a single memory cell to store multiple bits of information. For example, a memory cell operated with $2^n$ different threshold voltage levels is capable of storing n bits of information. Thus, the read operation can be performed by comparing the measured voltage exhibited by the memory cell to one or more reference read voltage levels in order to distinguish between two logical levels for single-level cells and between multiple logical levels for multi-level cells. The read reference voltages and the state widths of the threshold voltage distributions determine the edge margins available. The even edges determine the margin for program disturb and over-program, while the odd edges determine the margin for charge loss. The sum of all edge margins is usually defined as the read window budget (RWB). Therefore, a larger window allows larger margins, e.g., to read the cell correctly in the event of charge loss or disturb/over-program.

Certain memory devices and memory sub-systems attempt to reduce the error rates using a variety of techniques, including a valley tracking operation to determine an optimal read level. This can include, for example, determining a compensation offset value to account for a given memory cell's shift in threshold voltage. Since the threshold voltage shift can vary depending on process variations in each memory cell, the location of the memory cell (i.e., die to die variations), and the number of program/erase cycles performed on the cell, such a calibration process can be complicated. Certain memory devices perform an instantaneous read voltage calibration to adjust the read voltage level applied during a read operation. For example, certain memory devices can perform failed byte count read compensation (i.e., a digital failed byte count (Dcfbyte) operation) where a number of errors in one particular programming distribution (e.g., the highest voltage programming distribution among QLC memory cells) is determined at the start of the read operation, and the read voltage level can be adjusted based on the determined number of errors. Such a valley tracking operation, however, does not improve the read window budget in the memory device, which can cause achieving the reliability requirements related to the read recovery flow to remain challenging.

Additionally, die to die variations are not handled at the system level. Therefore, using the same voltage trim and media algorithm parameters for all dies in a device may result in reliability and performance issues. Some dies may require more read error handling or earlier detection of GBB than others, and other dies may have under-utilized performance margins, which may not be beneficial to the system. Currently, there are no solutions that address die to die variations directly, and not addressing die to die variations may result in suboptimal performance and reliability of the memory device.

Embodiments of the present disclosure address the above-noted and other deficiencies by implementing a memory sub-system that monitors the health index of a memory device at a die-level, and dynamically modifies one or more device parameters when the health index falls below a predefined threshold level. In one implementation, the memory sub-system monitors a read window budget (RWB) index reflecting a RWB of every die in the memory device, and updates the individual RWB index when a program-erase cycle (PEC) is performed on the individual dies. The memory sub-system computes a dynamic aggregate (e.g., a median) value of the RWB index of all the dies in the memory device and stores the dynamic aggregate (e.g., median) value in the metadata of the memory device. When the memory sub-system receives a request for performing a memory access operation from a host system, such as a write operation, read operation, or an erase operation, the memory sub-system compares the RWB index of the memory die on which the operation is being performed to the median value of the RWB index of all the dies in the memory device, and if the RWB index value is lower than the median value, then the memory sub-system dynamically modifies one or more device parameters of the memory die. For example, the memory sub-system may reduce a voltage for performing the memory access operation (e.g., a program operation or an erase operation) on the memory die.

In another implementation, the memory sub-system may monitor a trigger rate of every die in the memory device and update the individual trigger rates when a program-erase cycle (PEC) is performed on the individual dies. A "trigger rate" is a rate at which a portion of a memory system initiates (e.g., triggers) error recovery procedures. Trigger rates can be used to perform analysis of a memory sub-system or to implement improvements in the memory sub-system. Trigger rate monitoring can include accessing a count of error recovery initializations for a target memory portion, wherein the count of error recovery initializations corresponds to a number of times a first stage of a multi-stage error recovery process was performed. Trigger rate monitoring can further include accessing a count of read operations corresponding to the target memory portion. The count of error recovery initializations and the count of read operations can be used to compute a trigger rate. The trigger rate, or multiple trigger rates from various times or from various target memory portions, can be used to compute a metric for the memory portion(s). The memory sub-system may compute a dynamic aggregate (e.g., a median) value of the trigger rate of all the dies in the memory device and store the median value in the metadata of the memory device. When the memory sub-system receives a request for performing a memory access operation from a host system, such as a write operation, read operation, or an erase operation, the memory sub-system compares the trigger rate of the memory die on which the operation is being performed to the median value of the trigger rate of all the dies in the memory device, and if the trigger rate is greater than the median value, then the memory sub-system modifies one or more die-specific device parameters of the memory die. For example, the memory sub-system may reduce a voltage for performing the memory access operation (e.g., a program operation or an erase operation) on the memory die.

In yet another implementation, the memory sub-system may monitor a read disturb fold rate and a media scan fold rate of every die in the memory device, and update the individual read disturb fold rates and media scan fold rates when a program-erase cycle (PEC) is performed on the individual dies. The memory sub-system may compute a median value of the read disturb fold rates and media scan fold rates of all the dies in the memory device and store the median values in the metadata of the memory device. When the memory sub-system receives a request for performing a memory access operation from a host system, such as a write operation, read operation, or an erase operation, the memory sub-system compares the read disturb fold rate or media scan fold rate of the memory die on which the operation is being performed to the median value of the read disturb fold rate or media scan fold rate of all the dies in the memory device, and if the read disturb fold rate or media scan fold rate is greater than the median value, then the memory sub-system dynamically modifies one or more device parameters of the memory die. For example, the memory sub-system may increase a frequency for performing a media scan operation or a read disturb operation on the memory die depending on the fold rate that is outside of the threshold range.

Therefore, advantages of the systems and methods implemented in accordance with some embodiments of the present disclosure include, but are not limited to, improving RWB and reliability for memory dies with high PECs. The methods disclosed can also improve system performance by reducing folding activities after data retention. The methods disclosed can proactively detect deterioration in performance and take remedial measures to improve performance and reliability of the memory dies. For example, the methods disclosed can reduce trigger rate, read disturb fold rate, and media scan fold rate of the memory dies by dynamically modifying one or more device parameters including, but not limited to, reducing a voltage for performing a program operation, reducing a voltage for performing an erase operation, and increasing a frequency for performing a media scan operation or a read disturb operation on the memory die.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface or an ONFI bus to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a memory access management component 113, which can be used to implement techniques for monitoring health index of one or more memory dies in the memory device 130, and dynamically modifying one or more device parameters when the health index falls below a predefined threshold level. In some embodiments, the memory access management component 113 may implement a counter (e.g., a PEC counter), which may be incremented every time a program-erase operation is performed on one or more dies of the memory device 130. The counter may be stored in the metadata of the memory device 130 and may be updated each time a program-erase operation is performed on one or more dies of the memory device 130. In one implementation, the memory access management component 113 monitors a read window budget (RWB) index of every die in the memory device 130 and updates the individual RWB index when a program-erase cycle (PEC) is performed on the individual dies. In some embodiments, the RWB index can be determined using threshold voltage (Vt) data that may be collected by performing program operations on one or more dies of the memory device 130, and generating corresponding threshold voltage (Vt) curves, which may be used to determine the RWB index for the die. The RWB values may then be stored in the metadata of the memory device 130 and updated during use of the memory device 130 (e.g., when a program-erase cycle (PEC) is performed on the individual dies). The memory access management component 113 computes a dynamic aggregate (e.g., median) value of the RWB index of all the dies in the memory device and stores the dynamic aggregate (e.g., median) value in the metadata of the memory device 130. When the memory access management component 113 receives a request for performing a memory access operation from the host system 120, such as a write operation, read operation, or an erase operation, the memory access management component 113 compares the RWB index of the memory die on which the operation is being performed to the median value of the RWB index of all the dies in the memory device, and if the RWB index value is lower than the median value, then the memory access management component 113 dynamically modifies one or more device parameters of the memory device 130. For example, the memory access management component 113 may reduce a voltage for performing the memory access operation (e.g., a program operation or an erase operation) on one or more memory dies, thereby slowing degradation of the dies. The amount of reduction in voltage may be fixed (e.g., a fixed voltage) or it may be variable based on a subsequent reading of the RWB index of the memory die. The voltage adjustment may be an iterative process that may include initially reducing the voltage by a preset amount, measuring the RWB index of the die in response to the initial reduction, and reducing the voltage further if the RWB index is not equal to or greater than the median value of the RWB index of all the dies in the memory device 130. In some embodiments, the amount of reduction in voltage may be determined using threshold voltage (Vt) data that may be collected by performing one or more program operations or erase operations on one or more wordlines of the memory device, and generating corresponding threshold voltage (Vt) curves, which may be used to determine the voltage offset values. In some embodiments, the amount of reduction in voltage may be determined, for example, based on experimental and/or test data obtained by adjusting program voltage in similar memory devices, and storing the resultant voltage offset data in the metadata of the memory device, which may be initialized during manufacture of the memory device.

In another implementation, the memory access management component 113 may monitor a trigger rate of one or more dies in the memory device 130 and update the individual trigger rates when a program-erase cycle (PEC) is performed on the individual dies. The memory access management component 113 can calculate a trigger measure in a variety of ways. For example, the trigger measure can include a trigger rate, a trigger margin, or a combination thereof.

The trigger rate is an estimate of a frequency or a likelihood of implementing the error recovery mechanism. The trigger rate can further estimate a projection of the error measure for various conditions or situations, such as based on varying the programming step. The trigger rate can represent a projection of BER. For example, the trigger rate can be associated with uncorrectable bit error rate (UBER). Also, for example, the trigger rate can be based on ECC bits in error associated with the error recovery mechanism, a rate or a measure for the codewords, or a combination thereof.

The memory access management component 113 can calculate the trigger rate using an estimation mechanism. The estimation mechanism can include a process, a method, a circuit, a configuration, a function, or a combination thereof for projecting further behavior or pattern based on a given set of data. For example, the estimation mechanism can include a process, a method, a circuit, a configuration, a function, or a combination thereof for implementing a line fitting algorithm, such as for linear or logarithmic patterns, a statistical likelihood calculation, or a combination thereof.

The memory access management component 113 can calculate the trigger rate based on using the background records or a derivation thereof. The memory access management component 113 can project or estimate a frequency or a likelihood of implementing the error recovery mechanism, a projection of the error count, or a combination thereof according to a pattern or a trend in the background records.

The memory access management component 113 may compute a statistical aggregate (e.g., the median value, the weighted average value, etc.) of the trigger rate of all the dies in the memory device and store the median value in the metadata of the memory device. When the memory access management component 113 receives a request for performing a memory access operation from the host system 120, such as a write operation, read operation, or an erase operation, the memory access management component 113 compares the trigger rate of the memory die on which the operation is being performed to the median value of the trigger rate of all the dies in the memory device 130, and if the trigger rate is greater than the median value, then the memory access management component 113 dynamically modifies one or more device parameters of the memory device 130. For example, the memory access management component 113 may reduce a voltage for performing the memory access operation (e.g., a program operation or an erase operation) on one or more memory dies, thereby slowing degradation of the dies. The amount of reduction in voltage may be fixed (e.g., a fixed voltage) or it may be variable based on a subsequent reading of the trigger rate of the memory die. The voltage adjustment may be an iterative process that may include initially reducing the voltage by a preset amount, measuring the trigger rate of the die in response to the initial reduction, and reducing the voltage further if the trigger rate is not equal to or lesser than the median value of the trigger rate of all the dies in the memory device 130. In some embodiments, the amount of reduction in voltage may be determined using threshold voltage (Vt) data that may be collected by performing one or more program operations or erase operations on one or more wordlines of the memory device, and generating corresponding threshold voltage (Vt) curves, which may be used to determine the voltage offset values. In some embodiments, the amount of reduction in voltage may be determined, for example, based on experimental and/or test data obtained by adjusting program voltage in similar memory devices, and storing the resultant voltage offset data in the metadata of the memory device, which may be initialized during manufacture of the memory device.

In yet another implementation, the memory access management component 113 may monitor a read disturb fold rate of one or more dies in the memory device 130, and update the individual read disturb fold rates when a program-erase cycle (PEC) is performed on the individual dies. Read disturb is an example of a stress occurring on a NAND flash device that affects threshold voltage (Vt). As a host or application retrieves certain data from the flash device, the read disturb stress may build up if the host utilizes a particularly high read rate. For instance, if a logical block address (LBA) maps to a particular physical location of a NAND block, stresses may be induced on the unselected word lines because of the biasing condition within the block. Refreshing the data, e.g., folding, can be performed due to NAND 'Vt' sensitivity to read disturb and/or charge loss. For example, to counteract charge loss, refreshing can be done at regular intervals. Unnecessary refreshing is undesirable because refreshing affects the performance and/or endurance of the drive. In various embodiments, memory cell retirement and/or data folding can be dependent on determination of the RBER. Data folding may involve moving data from one memory die to another and marking the transferring memory die as being temporarily or permanently unusable. The memory access management component may compute a median value of the read disturb fold rates of all the dies in the memory device and store the median value in the metadata of the memory device. When the memory access management component 113 receives a request for performing a memory access operation from the host system 120, such as a write operation, read operation, or an erase operation, the memory access management component 113 compares the read disturb fold rate of the memory die on which the operation is being performed to the median value of the read disturb fold rate of all the dies in the memory device, and if the read disturb fold rate is greater than the median value, then the memory access management component 113 dynamically modifies one or more device parameters of the memory device 130. For example, the memory access management component 113 may increase a frequency for performing a read disturb operation on one or more memory dies, thereby ensuring consistent performance and reliability across all dies. The adjustment to the frequency for performing the read disturb operation may be fixed (e.g., a fixed frequency) or it may be variable based on a subsequent reading of the read disturb rate of the memory die. The frequency adjustment may be an iterative process that may include initially increasing the frequency by a preset amount, measuring the read disturb rate of the die in response to the initial increase, and increasing the frequency further if the read disturb rate is not equal to or lesser than the median value of the read disturb rate of all the dies in the memory device 130. In some embodiments, the increase in frequency may be determined, for example, based on experimental and/or test data obtained by adjusting read frequency in similar memory devices, and storing the resultant frequency offset data in the metadata of the memory device, which may be initialized during manufacture of the memory device.

In yet another implementation, the memory access management component 113 may monitor a media scan fold rate of one or more dies in the memory device 130 and update the individual media scan fold rates when a program-erase cycle (PEC) is performed on the individual dies. For example, folding of a particular block will result in garbage collection, consolidation, and erasure of the block, resulting in an increment of the erase counter and a reset of the read counter for a particular block. The reset of the read counter, in particular, may occur because the read disturb, data retention, and cross-temperature effects are generally eliminated when a block is erased and a memory cell returns to its native state. Other techniques for emphasizing or de-emphasizing read or erases of particular memory locations involved with host IO may also be utilized. The memory access management component may compute a median value of the media scan fold rates of all the dies in the memory device and store the median value in the metadata of the memory device. When the memory access management component 113 receives a request for performing a memory access operation from the host system 120, such as a write operation, read operation, or an erase operation, the memory access management component 113 compares the media scan fold rate of the memory die on which the operation is being performed to the median value of the media scan fold rate of all the dies in the memory device, and if the media scan fold rate is greater than the median value, then the memory access management component 113 dynamically modifies one or more device parameters of the memory device 130. For example, the memory access management component 113 may increase a frequency for performing a media scan operation on one or more memory dies, thereby ensuring consistent performance and reliability across all dies. The adjustment to the frequency for performing the media scan operation may be fixed (e.g., a fixed frequency) or it may be variable based on a subsequent reading of the media scan rate of the memory die. The frequency adjustment may be an iterative process that may include initially increasing the frequency by a preset amount, measuring the media scan rate of the die in response to the initial increase, and increasing the frequency further if the media scan rate is not equal to or lesser than the median value of the read disturb rate of all the dies in the memory device 130. In some embodiments, the increase in frequency may be determined, for example, based on experimental and/or test data obtained by adjusting read frequency in similar memory devices, and storing the resultant frequency offset data in the metadata of the memory device, which may be initialized during manufacture of the memory device.

Figure 2:
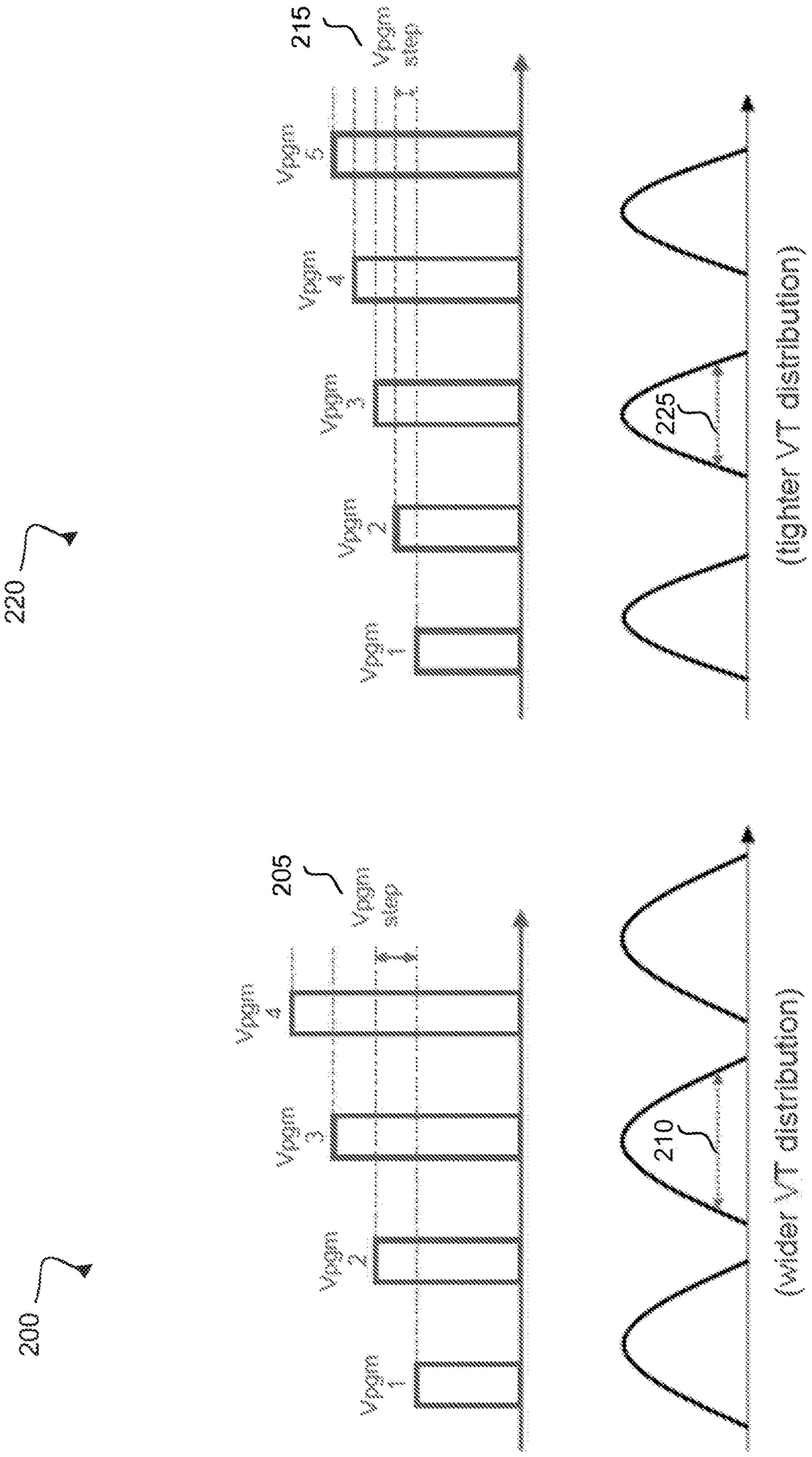
FIG. 2 illustrates an example method for determining a read window budget (RWB) of a die in a memory device, in accordance with one or more aspects of the present disclosure.

FIG. 2 illustrates example methods 200, 220 for determining a read window budget (RWB) index of a die in a memory device, in accordance with one or more aspects of the present disclosure. Methods 200, 220 may be performed by processing logic that includes hardware (e.g., circuitry, dedicated logic, programmable logic, microcode, etc.), software (e.g., instructions run on a processor to perform hardware simulation), or a combination thereof. In some embodiments, methods 200, 220 are performed by the memory access management component 113 of FIG. 1. In one implementation, the method 200, 220 may include using a counter that may be incremented every time a program-erase operation (e.g., program-erase cycle (PEC)) is performed on one or more memory dies of the memory device. The method 200 may further include assigning a program voltage offset 205 based on the number of PECs already performed on the memory device. For example, dies with low number of PECs (e.g., 3000 PEC or less) may be assigned a higher program voltage offset 205. Similarly, in method 220, dies with high number of PECs (e.g., more than 3000 PEC) may be assigned a smaller program voltage offset 215. As illustrated in FIG. 2, dies with lower number of PECs tend to have wider threshold voltage (Vt) distributions, therefore larger RWB indexes 210, and dies with higher number of PECs tend to have tighter threshold voltage (Vt) distributions, and therefore smaller RWB indexes 225. In some embodiments, the RWB index 210, 225 can be determined using threshold voltage (Vt) data that may be collected by performing program operations on one or more dies of the memory device 130, and generating corresponding threshold voltage (Vt) curves, which may be used to determine the RWB index 210, 225 for the die. The RWB index 210, 225 values may then be stored in the metadata of the memory device 130 and updated during use of the memory device 130 (e.g., when a program-erase cycle (PEC) is performed on the individual dies).

Figure 3:
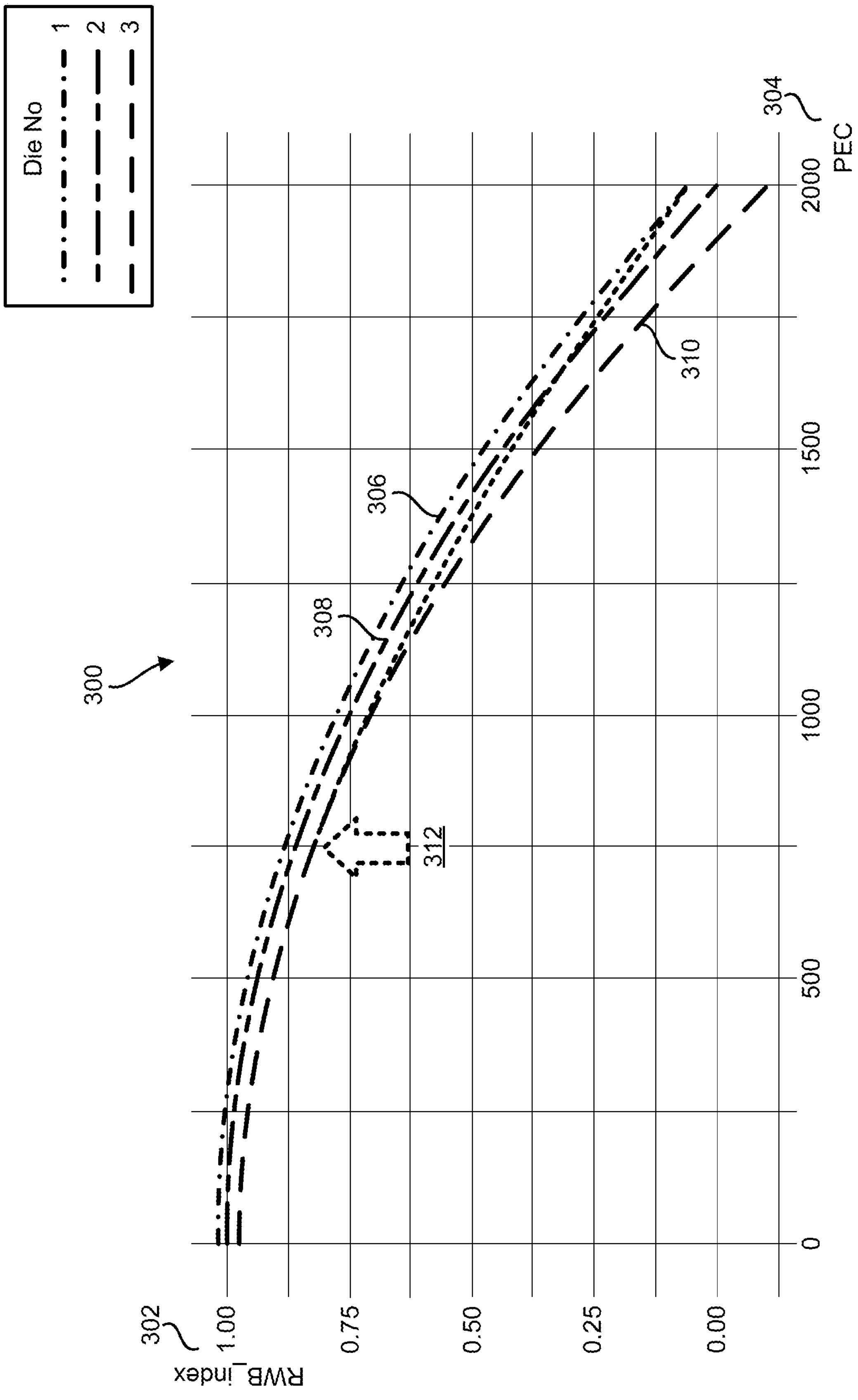
FIG. 3 schematically illustrates a method for monitoring health of a die in a memory device and dynamically adjusting one or more device parameters, in accordance with one or more aspects of the present disclosure.

FIG. 3 schematically illustrates a method 300 for monitoring health of a die in a memory device and dynamically adjusting one or more device parameters, in accordance with one or more aspects of the present disclosure. In the example illustrated, the memory device includes three example dies (e.g., Die 1, Die 2, and Die 3). The RWB index 302 of these dies is shown in the X-axis, and the number of PEC 304 is shown on the Y-axis of the graph. Dies 1, 2, 3, have separate curves 306, 308, 310, respectively, where the RWB index is plotted against the number of PEC. As shown in the graph, initially all dies have the same RWB index of 1 (e.g., when the memory device is initially put to use). However, as time passes and the number of PEC increases, each die behaves differently, and the RWB index may reflect the degradation in the respective dies. For example, as illustrated in FIG. 3, die 1 has better performance than die 2, and die 2 has better performance than die 3. The memory sub-system controller may maintain RWB index values for all dies, which will be described in further detail with respect to FIG. 4. The RWB index values may then be stored in the metadata of the memory device 130 and updated dynamically during use of the memory device 130 (e.g., when a program-erase cycle (PEC) is performed on the individual dies). The memory sub-system controller computes a median value of the RWB index of all the dies in the memory device and stores the median value in the metadata of the memory device 130. When the memory sub-system controller receives a request for performing a memory access operation from the host system 120, such as a write operation, read operation, or an erase operation, the memory sub-system controller compares the RWB index of the memory die on which the operation is being performed to the median value of the RWB index of all the dies in the memory device, and if the RWB index value is lower (or significantly lower) than the median value, then the memory sub-system controller may modify one or more device parameters of the memory device 130. Here, this deviation may be noticed at point 312 on the curve where die 3's performance has significantly degraded in comparison to dies 1 and 2. In such an instance, the memory sub-system controller may reduce a voltage for performing the memory access operation (e.g., a program operation or an erase operation) on one or more memory dies, thereby slowing degradation of the dies. For example, if the program operation was going to be performed at a voltage of 1.0V, the memory sub-system controller may reduce the voltage to 0.5V such that a softer program operation is performed on die 3. Similarly, if an erase operation was going to be performed at a voltage of 1.0V, the memory sub-system controller may reduce the voltage to 0.5V such that a softer erase operation is performed on die 3. The amount of reduction in voltage may be determined, for example, by adjusting program voltage in similar memory devices, and storing the resultant voltage offset data in the metadata of the memory device. The memory sub-system controller is therefore configured to detect die-to-die variation of RWB indexes and optimize performance for systems with two or more dies.

FIG. 4 schematically illustrates example metadata 400 maintained by the memory sub-system controller 115 for monitoring a health index of one or more dies of the memory device 130 and dynamically modifying one or more device parameters, in accordance with embodiments of the present disclosure. Metadata 400 may include die numbers 402 for each die in a memory device, and their respective RWB indexes 404. In the example shown here, die 1 has a RWB index of 0.9, die 2 has a RWB index of 0.7, and die 3 has a RWB index of 0.8, and so on and so forth. The memory sub-system controller may compute a median value 406 of the RWB index of all the dies in the memory device and store the median value in the metadata 400 of the memory device. When the memory sub-system controller receives a request for performing a memory access operation from the host system 120, such as a write operation, read operation, or an erase operation, the memory sub-system controller compares the RWB index 408 of the memory die on which the operation is being performed (e.g., die 2) to the median value 406 of the RWB index of all the dies in the memory device, and if the RWB index value 408 is lower than the median value 406, then the memory sub-system controller may modify one or more device parameters of the memory device 130. For example, the memory sub-system controller may reduce a voltage for performing the memory access operation (e.g., a program operation or an erase operation) on one or more memory dies, thereby slowing degradation of the dies. For example, if the program operation was going to be performed at a voltage of 1.0V, the memory sub-system controller may reduce the voltage to 0.5V such that a softer program operation is performed on die 2. Similarly, if an erase operation was going to be performed at a voltage of 1.0V, the memory sub-system controller may reduce the voltage to 0.5V such that a softer erase operation is performed on die 2. The amount of reduction in voltage may be determined, for example, by adjusting program voltage in similar memory devices, and storing the resultant voltage offset data in the metadata of the memory device.

Figure 5:
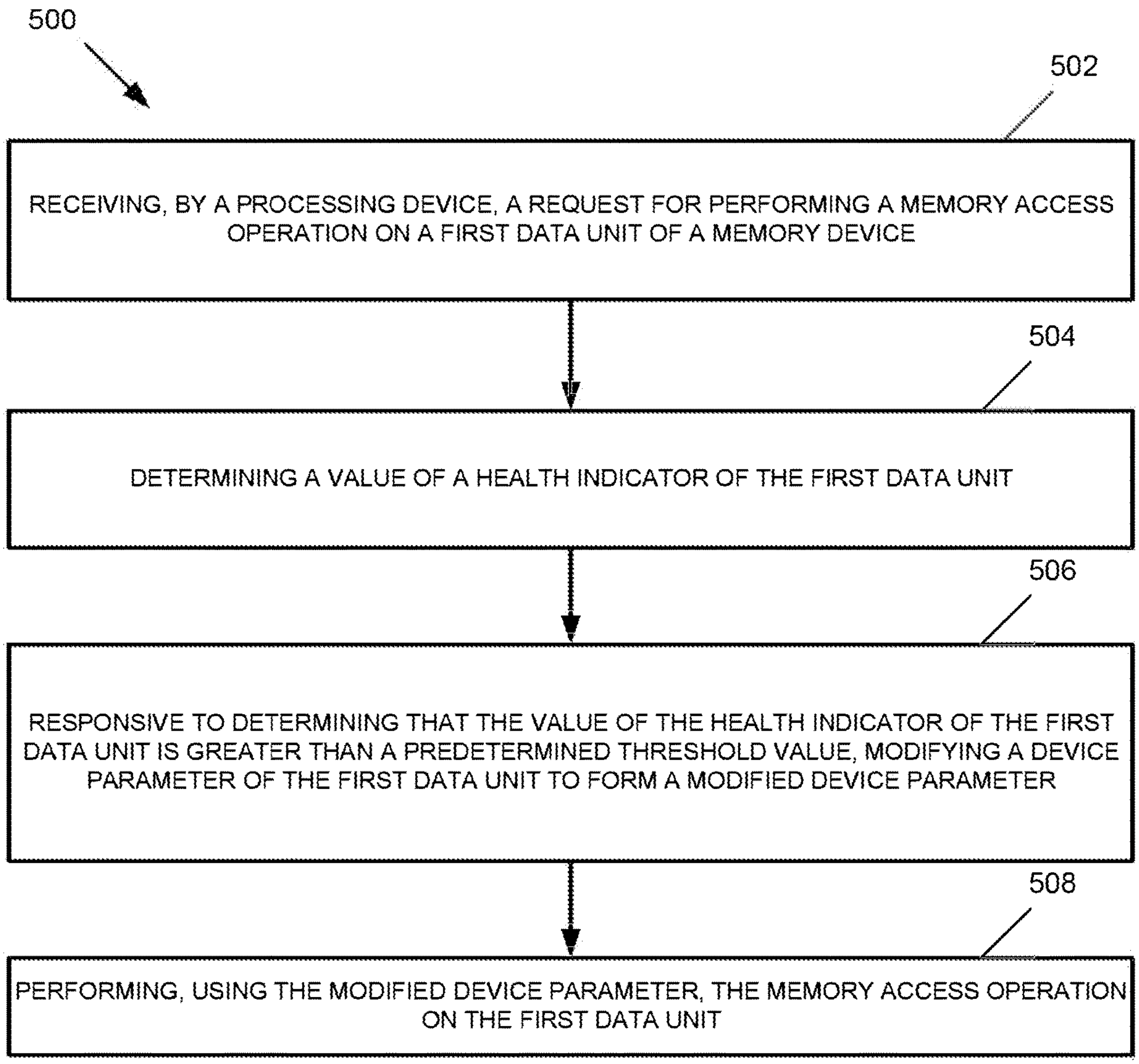
FIG. 5 is a flow diagram of an example method for monitoring health of a die in a memory device and dynamically adjusting one or more device parameters, in accordance with one or more aspects of the present disclosure.

FIG. 5 is a flow diagram of an example method 500 for monitoring health of a die in a memory device and dynamically adjusting one or more device parameters, in accordance with one or more aspects of the present disclosure. The method 500 can be performed by a processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the memory access management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 502, the processing logic of the processing device (e.g., processor 117) may receive a request for performing a memory access operation (e.g., a read, write, or program operation) on a die of a memory device (e.g., memory device 130). At operation 504, the processing logic of the processing device may determine a value of a media state metric of the die. The media state metric may reflect, for example, a RWB index, a trigger rate, a read disturb fold rate, or a media scan fold rate of the die. At operation 506, the processing logic of the processing device may determine that the value of the media state metric of the die is outside of a predetermined threshold range. In some embodiments, the predetermined threshold range can be the median value of the media state metric for all the dies in the memory device. In response to the media state metric of the die is outside of a predetermined threshold range, the processing logic of the processing device may modify a device parameter of the memory die to form a modified device parameter. At operation 508, the processing logic of the processing device may perform the memory access operation on the die using the modified device parameter. In some embodiments, modifying the device parameter of the memory die may include reducing a voltage for performing a program operation or an erase operation on the die. In some embodiments, modifying the device parameter of the memory die may include increasing a frequency for performing a media scan operation on the die. In some embodiments, modifying the device parameter of the memory die may include increasing a frequency for performing a read disturb operation on the die.

As discussed above, read disturb effects in flash memory can cause data loss if not addressed in a timely fashion, such that ever more efficient methods of mitigating read disturb effects are desired. Accordingly, several embodiments of memory devices in accordance with the present technology can perform word line scans to detect localized read disturb effects before they become problematic (e.g., before uncorrectable bit errors occur). The word line scan can determine an error count (e.g., an RBER) for each word line in a tracked subset of memory addresses (e.g., a single memory block, a group of memory blocks, a memory superblock, a group of word lines corresponding to less than a memory block, etc.) and outputs a value corresponding to the error count of the word line with the highest error count (e.g. the word line that has experienced the largest amount of read disturb effects). If the word line scan reveals an amount of errors that indicates that the data in the tracked subset is experiencing levels of read disturb effects that can cause errors, then a relocation operation can be performed or scheduled for future performance.

Figure 6:
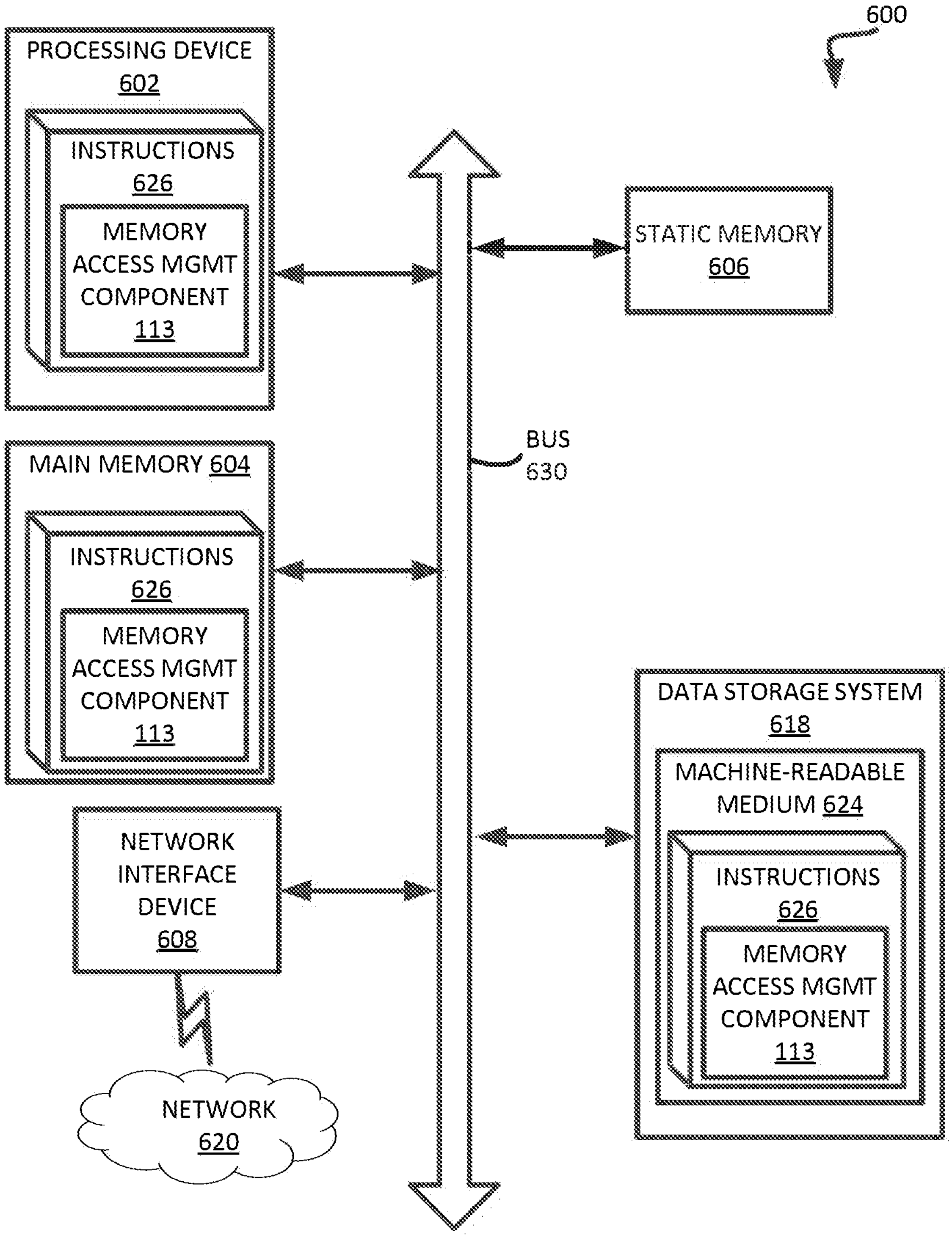
FIG. 6 illustrates an example machine of a computer system within which a set of instructions, for causing the machine to perform any one or more of the methodologies discussed herein, can be executed.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 16 of FIG. 1) or can be used to perform the operations of a controller (e.g., to execute an operating system to perform operations corresponding to memory access management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 16 of FIG. 1.

In one embodiment, the instructions 626 include instructions to implement functionality corresponding to memory access management component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
- a memory device; and
- a processing device, operatively coupled with the memory device, to perform operations comprising:
  - receiving a request for performing a memory access operation on a first memory die of the memory device;
  - determining a value of a media state metric of the first memory die;
  - responsive to determining that the value of the media state metric of the first memory die is greater than a predetermined threshold value, modifying a device parameter of the first memory die to form a modified device parameter, wherein the device parameter specifies a voltage offset for performing one of: a program operation or an erase operation on the first memory die; and
  - performing, using the modified device parameter, the memory access operation on the first memory die.

2. The system of claim 1, wherein the predetermined threshold value reflects a dynamic aggregate value of the media state metric of a plurality of memory dies of the memory device.

3. The system of claim 1, wherein the media state metric comprises at least one of a trigger rate, a read disturb fold rate, or a media scan fold rate of the first memory die.

4. The system of claim 1, wherein modifying the device parameter of the first memory die further comprises:
- reducing a voltage for performing a program operation or an erase operation on the first memory die.

5. The system of claim 1, wherein modifying the device parameter of the first memory die further comprises:
- increasing a frequency for performing a media scan operation on the first memory die.

6. The system of claim 1, wherein modifying the device parameter of the first memory die further comprises:
- increasing a frequency for performing a read operation on the first memory die.

7. The system of claim 1, wherein modifying the device parameter of the first memory die further comprises:
- decreasing a frequency for performing a media scan or read operation on the first memory die.

8. A method, comprising:
- receiving, by a processing device, a request for performing a memory access operation on a first memory die of a memory device;
- determining a value of a media state metric of the first memory die;
- responsive to determining that the value of the media state metric of the first memory die is greater than a predetermined threshold value, modifying a device parameter associated with the first memory die to form a modified device parameter, wherein the device parameter specifies a voltage offset for performing one of: a program operation or an erase operation on the first memory die; and
- performing, using the modified device parameter, the memory access operation on the first memory die.

9. The method of claim 8, wherein the predetermined threshold value reflects a dynamic aggregate value of the media state metric of a plurality of memory dies of the memory device.

10. The method of claim 8, wherein the media state metric reflects at least one of: a trigger rate, a read disturb fold rate, or a media scan fold rate of the first memory die.

11. The method of claim 8, the device parameter of the first memory die specifies a frequency for performing a media scan operation on the first memory die.

12. The method of claim 8, wherein the device parameter of the first memory die specifies a frequency for performing a read operation on the first memory die.

13. A non-transitory computer-readable storage medium comprising instructions that, when executed by a processing device, cause the processing device to perform operations comprising:
- receiving a request for performing a memory access operation on a first memory die of a memory device;
- determining a value of a media state metric of the first memory die;
- responsive to determining that the value of the media state metric of the first memory die is greater than a predetermined threshold value, modifying a device parameter of the first memory die to form a modified device parameter, wherein the device parameter specifies a voltage offset for performing one of: a program operation or an erase operation on the first memory die; and performing, using the modified device parameter, the memory access operation on the first memory die.

14. The non-transitory computer-readable storage medium of claim 13, wherein the predetermined threshold value reflects a dynamic aggregate value of the media state metric of a plurality of memory dies of the memory device.

15. The non-transitory computer-readable storage medium of claim 13, wherein the media state metric comprises at least one of a trigger rate, a read disturb fold rate, or a media scan fold rate of the first memory die.

16. The non-transitory computer-readable storage medium of claim 13, wherein modifying the device parameter of the first memory die further comprises:

reducing a voltage for performing a program operation or an erase operation on the first memory die.

17. The non-transitory computer-readable storage medium of claim 13, wherein modifying the device parameter of the first memory die further comprises:

increasing a frequency for performing a media scan operation on the first memory die.

18. The non-transitory computer-readable storage medium of claim 13, wherein modifying the device parameter of the first memory die further comprises:

increasing a frequency for performing a read disturb operation on the first memory die.

19. The non-transitory computer-readable storage medium of claim 13, wherein modifying the device parameter of the first memory die further comprises:

decreasing a frequency for performing a media scan or read operation on the first memory die.

* * * * *